(12) United States Patent
Cooper et al.

(10) Patent No.: US 10,144,842 B2
(45) Date of Patent: Dec. 4, 2018

(54) HIGH REFRACTIVE INDEX NANOCOMPOSITE LAYER

(71) Applicant: PIXELLIGENT TECHNOLOGIES LLC, Baltimore, MD (US)

(72) Inventors: Gregory Cooper, Fulton, MD (US); Wei Xu, Basking Ridge, NJ (US); Zhiyun Chen, Rockville, MD (US)

(73) Assignee: PIXELLIGENT TECHNOLOGIES LLC, Baltimore, MD (US)

( * ) Notice: Subject to any disclaimer, the term of this patent is extended or adjusted under 35 U.S.C. 154(b) by 360 days.

(21) Appl. No.: 14/591,504

(22) Filed: Jan. 7, 2015

(65) Prior Publication Data

US 2015/0203709 A1 Jul. 23, 2015

Related U.S. Application Data

(63) Continuation-in-part of application No. 14/211,971, filed on Mar. 14, 2014.

(60) Provisional application No. 61/924,323, filed on Jan. 7, 2014, provisional application No. 61/790,156, filed on Mar. 15, 2013.

(51) Int. Cl.
| | |
|---|---|
| *C09D 135/02* | (2006.01) |
| *C09D 7/62* | (2018.01) |
| *C09D 133/06* | (2006.01) |
| *C09D 5/00* | (2006.01) |
| *C09D 4/00* | (2006.01) |
| *B82Y 30/00* | (2011.01) |
| *C08L 33/06* | (2006.01) |
| *C08K 3/22* | (2006.01) |
| *H01L 51/00* | (2006.01) |
| *B05D 7/00* | (2006.01) |

(52) U.S. Cl.
CPC ........... *C09D 135/02* (2013.01); *B05D 7/546* (2013.01); *C08L 33/06* (2013.01); *C09D 4/00* (2013.01); *C09D 5/00* (2013.01); *C09D 7/62* (2018.01); *C09D 133/06* (2013.01); *H01L 51/00* (2013.01); *B82Y 30/00* (2013.01); *C08K 3/22* (2013.01); *C08K 2003/2241* (2013.01); *C08K 2201/011* (2013.01); *Y10T 428/31645* (2015.04); *Y10T 428/31667* (2015.04); *Y10T 428/31786* (2015.04); *Y10T 428/31909* (2015.04); *Y10T 428/31938* (2015.04)

(58) Field of Classification Search
None
See application file for complete search history.

(56) References Cited

U.S. PATENT DOCUMENTS

| | | | |
|---|---|---|---|
| 6,833,667 B2 | 12/2004 | Hamano et al. | |
| 7,164,454 B2 | 1/2007 | Numata et al. | |
| 7,800,100 B2 | 9/2010 | Lee et al. | |
| 7,936,412 B2 | 5/2011 | Numata et al. | |
| 8,088,499 B1* | 1/2012 | Wang | H01L 51/5048 257/40 |
| 8,279,535 B2 | 10/2012 | Hsu et al. | |
| 8,767,139 B2 | 7/2014 | Namata et al. | |
| 2001/0033135 A1* | 10/2001 | Duggal | B82Y 20/00 313/506 |
| 2002/0084952 A1 | 7/2002 | Morley et al. | |
| 2003/0164679 A1 | 9/2003 | Hamano et al. | |
| 2003/0170493 A1* | 9/2003 | Chen | H01L 27/3246 428/690 |
| 2004/0217702 A1 | 11/2004 | Garner | |
| 2006/0006795 A1* | 1/2006 | Strip | H01L 51/5265 313/504 |
| 2006/0105483 A1 | 5/2006 | Leatherdale et al. | |
| 2006/0210726 A1 | 9/2006 | Jones et al. | |
| 2007/0042174 A1 | 2/2007 | Rao | |
| 2008/0079355 A1 | 4/2008 | Smith | |
| 2008/0119583 A1* | 5/2008 | Jones | B82Y 30/00 522/113 |
| 2010/0117503 A1 | 5/2010 | Mizuno et al. | |
| 2011/0080513 A1 | 4/2011 | Hsu et al. | |
| 2011/0262093 A1 | 10/2011 | Lamansky | |
| 2012/0043678 A1 | 2/2012 | Numata et al. | |
| 2012/0099323 A1 | 4/2012 | Thompson | |
| 2012/0223873 A1 | 9/2012 | Ohta | |
| 2013/0221279 A1 | 8/2013 | Xu et al. | |
| 2014/0322549 A1 | 10/2014 | Xu et al. | |
| 2015/0203709 A1 | 7/2015 | Cooper et al. | |
| 2015/0380688 A1 | 12/2015 | Chen et al. | |
| 2016/0149163 A1 | 5/2016 | Chen et al. | |

FOREIGN PATENT DOCUMENTS

| | | |
|---|---|---|
| CN | 2001821616 | 9/2004 |
| CN | 1960000 | 5/2007 |
| CN | 102844904 | 12/2012 |
| JP | 2003-031782 | 1/2003 |
| WO | WO 2008/026862 | 3/2008 |

(Continued)

OTHER PUBLICATIONS

Office Action dated Mar. 28, 2017, issued in connection with U.S. Appl. No. 14/591,504, "High Refractive Index Nanocompsosite Layer", inventor(s): Gregory Cooper et al, Applicant(s): Pixelligent Technologies LLC.
Office Action (English translation) dated Jul. 24, 2017 received in CN201480049299.8 (Pixelligent Technologies LLC; Apr. 2016; Advanced Light Extraction Structure).
U.S. Appl. No. 14/903,822, filed Jan. 2016, Chen et al.
International Search Report for PCT/US2014/045671 dated Nov. 24, 2014, five pages.
Written Opinion of the ISA for PCT/US2014/045671 dated Nov. 24, 2014, seven pages.

(Continued)

*Primary Examiner* — Sheeba Ahmed
(74) *Attorney, Agent, or Firm* — Nixon & Vanderhye P.C.

(57) ABSTRACT

The present invention relates to an OLED internal light extraction scheme with graded-index layer and embedded scattering particles.

20 Claims, 9 Drawing Sheets

(56) References Cited

FOREIGN PATENT DOCUMENTS

WO    WO 2012/058271 A2    5/2012
WO    WO 2015/006276 A1    1/2015

OTHER PUBLICATIONS

Office Action dated Jun. 15, 2017 received in U.S. Appl. No. 14/903,822 (Chen et al; Title: Advanced Light Extraction Structure; filed Jan. 8, 2016).
Claims filed Mar. 7, 2017 in copending U.S. Appl. No. 14/903,822 (Chen et al, "Advanced Light Extraction Structure", filed Jan. 8, 2016).
Office Action dated Aug. 17, 2017 received in U.S. Appl. No. 14/211,971 (Xu et al; Title: High Refractive Index Nanocomposite; filed Mar. 14, 2014).

\* cited by examiner

HIGH REFRACTIVE INDEX NANOCOMPOSITE LAYER

The present application is a continuation-in-part of U.S. patent application Ser. No. 14/211,971, filed Mar. 14, 2014, which claims the benefit of U.S. Provisional Application No. 61/790,156, filed Mar. 15, 2013; the present application also claims the benefit of U.S. Provisional Application No. 61/924,323, filed Jan. 7, 2014, the entire contents of each of which are hereby incorporated by reference.

Polymeric coating materials described herein exhibit high optical transmittance in the visible spectrum. The materials of the present disclosure may be easily coated onto the surface of desired substrates via common coating processes, such as by spin coating, screen printing, dip, roll-to-roll, slot die, draw bar, or spray coating, for many electronic applications. The thickness of coatings described herein may range from tens of nanometers to millimeters, as may be required for specific applications. The materials of the present disclosure are unique in additionally providing a high refractive, high transparency film or coating or layer, as may be desirable in electronics applications where light coupling is important to the performance.

For example, in a traditional Organic Light Emitting Diode (OLED), only ~30% of light generated is emitted to the environment, while the remaining light is generally lost in the device. A high percentage of this loss is due to the low refractive index (RI) of the encapsulation materials. A high refractive index high transparency organic coating, with a refractive index around 1.8 or higher, as may be produced with a material of the present disclosure, may dramatically enhance the efficacy of the OLED lighting and display devices including same. High refractive index coatings of the present disclosure will also be advantageously incorporated in other devices, such as light emitting diode (LED) lighting, light emitting diode (LED) displays, touch screens, sensors, and solar cells.

Figure 1A:
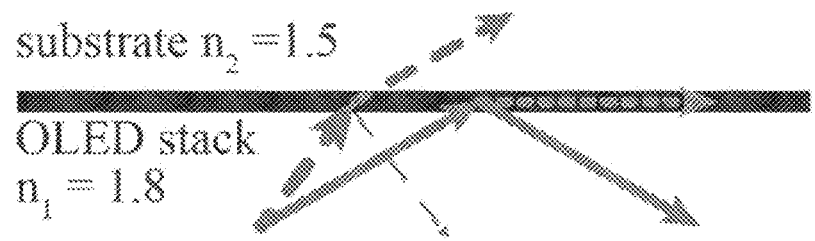

The most prevalent light extraction scheme in current commercial OLED lighting is to roughen the surface of the substrate or to apply periodic structures on the substrate as external light extraction structures, such as the films provided by 3M. However, such external light extraction can only address the light loss at the glass/air interface and not the light lost at other interfaces, most notably at the ITO/glass interface, as shown in FIG. 1A. The light extraction efficiency of most state-of-the-art OLED lighting technology is only ~40%, even for phosphorescent emitter where with nearly 100% internal quantum efficiency.

Figure 1B:
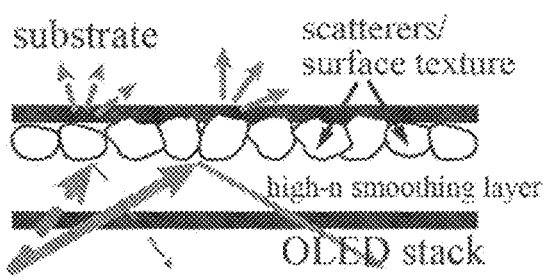

The root cause of the light extraction problem is the mismatch of the Refractive Indexes (RI) between where light is created in the device and where light is needed. The losses by Fresnel reflection and total internal reflection (TIR) at the interfaces in the device quickly add up, as illustrated in FIG. 1B.

To recoup a larger portion of the light loss, an efficient OLED internal light extraction structure is critical, and it must be cost effective and compatible with existing OLED manufacturing processes to be commercially successful. One popular scheme is to introduce light scatters or surface texture at the interface between the OLED layer, more specifically the ITO electrode, and the substrate, as shown in FIG. 1B. In order to generate sufficient light scattering events over a short distance, the concentration of the light scatters has to be large at the interface, which scatters light indiscriminately, resulting in the unnecessary scattering of the light that is within the cone of acceptance. Also, the scatterers at the interface lead to poor surface quality that requires an application of a high-index smoothing layer to prevent current leakage and defective devices. This extra smoothing layer increases the processing complexity.

Figure 1C:
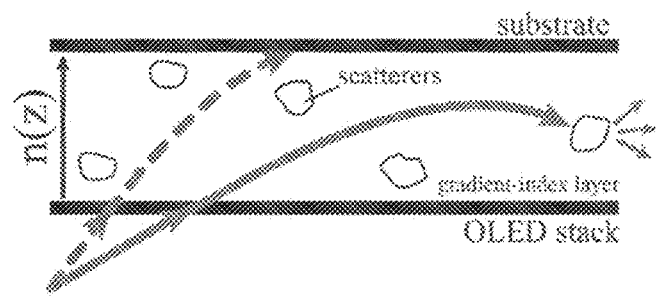

The present invention comprises an innovative internal light extraction scheme based on a nanocomposite gradient-index layer sparsely embedded with light scattering centers, a UV curable coating formulation consisting of $ZrO_2$ nanocrystals dispersed into an acrylic polymer that is applied with slot die coating, where the gradient-index is achieved by varying the concentration of nanocrystals. Incorporating a gradient-index offers two main benefits: First, a gradient-refractive index profile (or a discreet approximation, i.e. thin layers with small index changes) can significantly suppress Fresnel reflection; Second, only a low concentration of light scatterers is needed. Because in a gradient-index layer, light rays that travel outside the acceptance cone are bent backward, the optical paths of these rays are significantly longer compared with the rays that transmit within the cone of acceptance, as shown in FIG. 1C. By introducing a small concentration of light scatterers inside the gradient-index layer, the present invention allows the light that requires extraction to be more likely to be scattered, than the light that would escape on its own.

The index profile may be created by a multiple step film application and partial curing process to allow the inter-diffusion of the nanocrystals, see FIG. 2, and the scatterers can be introduced either by mixing in high refractive index particles such as micron sized $TiO_2$ particles, low refractive index polymer droplets, or controlled agglomeration of $ZrO_2$ nanocrystals. More than two layers of nanocomposites with increasing nanocrystal loadings can be used to create the intended index profile. After each layer is applied, it may be partially cured before the next layer is applied. The partial curing is necessary to preserve the integrity of the layer while still allowing for the inter-diffusion of the nanocrystals to avoid abrupt index change. An overall curing may be carried out after the entire stack is formed.

Pixelligent's high quality nanocomposite materials (see FIG. 2) are ideal for deliberately constructing desired gradient-index profile by laying down several nanocomposite layers with different nanocrystal loadings.

The presently disclosed nanocomposite materials include various metal oxides, such as zirconium oxide, titanium oxide, hafnium oxide, and zinc oxide, have high bulk refractive indexes, typically larger than 2 in the visible spectrum, as well as exceptional transparency. In many electronic applications, the high cost, high temperature processing conditions required and the rigid and brittle nature of the inorganic metal oxide coatings have limited their use in the art.

By combining the organic coating materials of the present disclosure with metal oxide nanocrystals as described herein, the presently described materials make it possible to produce easily processable unique flexible and thin film coatings with a high refractive index and high optical transparency.

As described herein, nanocrystals of the present disclosure have diameters much smaller than the wavelength of the light to minimize light scattering, while also maintain dispersibility or agglomeration-free in an organic or polymer or monomer matrix. Such physical characteristics of the presently disclosed materials not only reduce light scattering but also make for an exceptional processability.

The nanocrystals of the presently described material include specific functional group, also referred to as capping agents, or capping groups. These specific functional groups have been grafted to the surface of the nanocrystals. Such nanocrystals are described herein as well as in U.S. patent application Ser. No. 13/064,905 (filed Apr. 25, 2011 and published as US 2012-0088845A1 on Apr. 12, 2012—Williams et al), the entire content of which is incorporated herein by reference.

Exemplified capping agents demonstrated in the present disclosure include 2-[2-(2-9-methoxyethoxy)ethoxy]acetic acid and/or methoxy(triethyleneoxy) propyltrimethoxysilane and/or 3-methacryloyloxypropyltrimethoxysilane and/or n-octyl trimethoxysilane and/or dodecyltrimethoxysilane and/or m,p-ethylphenethyl trimethoxysilane.

Capping of nanocrystals may require a solvent exchange as as-synthesized nanocrystals may be surface modified in a solvent other than the solvent of nanocrystals synthesis. Solvent exchange may be accomplished by, for example, decanting reaction liquor and rinsing the nanocrystals with the capping solvent, which may then be used as a washing or rinsing solvent that is itself decanted to produce a wet cake of uncapped nanocrystals.

For example to perform the surface modification of the nanocrystals with 2-[2-(2-9-methoxyethoxy)ethoxy]acetic acid, the nanocrystals are suspended in the capping solvent, for example, toluene for 2-[2-(2-9-methoxyethoxy)ethoxy] acetic acid modification, preferably at a loading of 10 wt % or greater, more preferably 20 wt % or greater, still more preferably, 30 wt % or greater, calculated based on the weight of the wet nanocrystal cake. While the suspension is being stirred, the capping agent is added to it slowly. The amount of capping agent used is 8-60 wt % to the weight of the wet nanocrystal cake. The suspension is allowed to stir at 20-27 C for 10-30 minutes and then refluxed at the boiling point of the capping solvent for 30-60 minutes. After refluxing, the clear solution is cooled to 50-60 C slowly. This suspension is then filtered to remove dust and aggregates bigger than 200 nm. The capped nanocrystals are then precipitated out from the capping solvent using heptane. The precipitated nanocrystals are collected by centrifugation. The nanocrystals thus collected are dispersed in tetrahydrofuran (THF) and again re-precipitated using heptane. This process is repeated twice. The wet cake of nanocrystals collected in the final step is dried under vacuum.

The presently disclosed material or formulation may also be made as a solvent free formulation or as a formulation or material with a low or reduced solvent content. Such low or no solvent materials are desirable both because of environmental and health purposes and because of processing constraints and/or limitations.

The nanocrystals of the present disclosure therefore are uniquely dispersible directly into an organic material without the need or requirement for solvent(s).

Metal oxide nanocrystals of the present disclosure are, for example, mono-dispersible, with an average size range of 3-7 nm, and containing a surface treatment that aids in dispersion of the nanocrystals in a large variety of solvents and polymers. The presently disclosed material advantageously does not require the inclusion of solvents and the nanocrystals of the present disclosure are dispersible in the polymer and/or monomer material of the present disclosure, without the inclusion of solvents or additional dispersing agents. These nanocrystals, which have been surface modified with capping agents, possess greater compatibility with monomers and/or oligomers and/or polymers without reduction in processability. The surface modified nanocrystals of the present application may be formulated in a resin mixture that is transparent and has a viscosity that allows spin coating of, for example, 3-4 micron thick films. The films of the present disclosure additionally demonstrate high refractive index, high optical transmittance in the visible spectrum, and are thermally stable at temperatures above 120 C, or above 175 C, or above 200 C.

The films according to the present disclosure possess a high refractive index of 1.6 and higher at 400 nm, or 1.7 and higher at 400 nm, or 1.8 and higher at 400 nm, or 1.9 at 400 nm. The refractive index of the films according to the present disclosure may range from 1.6 to 1.9 at 400 nm.

Films of the present disclosure additionally or alternatively possess high optical (440-800 nm) transmittance of 80% or 82%, or 86%, or 88%, or 90%, or 92%, or 94%, or 96%, or 98%, and above for films that are less than 5 microns thick. The films of the present disclosure therefore possess a high optical (440-800 nm) transmittance in the range of 80% to 98% and above for films that are less than 5 microns thick. The transmittance of a film according to the present disclosure may be measured with a Perkin-Elmer UV-Vis Lambda spectrophotometer, wherein the film is coated on a fused silica substrate and another blank fused silica of the same quality and thickness is used as a reference. FIG. 4A, FIG. 4B, FIG. 5A, FIG. 5B, FIG. 6A, and FIG. 6B are examples of the absorbance and transmission results of these films. The ripples shown in these curves are the results of interference of the incoming light and the reflected light at the film/substrate interface.

An exemplary non-limiting embodiment of a coating formulation of the present disclosure comprises or contains a mixture of acrylic monomers and/or oligomers, and capped or surface treated zirconium oxide nanocrystals. The loading or amount of the nanocrystals included in a formulation of the present disclosure is in the range of 50 wt % to 90 wt % based on the weight of the entire formulation, such as a loading of 50 wt % or greater, or 55 wt % or greater, or 60 wt % or greater, or 65 wt % or greater, or 70 wt % or greater, or 75 wt % or greater, or 80 wt % or greater, or 90 wt %.

In addition to the noted nanocrystals, a formulation or material or composition or film or coating of the present disclosure may additionally comprise a curing agent and/or a photo-initiator.

In addition to the noted nanocrystals, a formulation or material or composition of the present disclosure may additionally comprise or contain acrylic monomers, such as benzyl methacrylate (BMA) and trimethylolpropane triacrylate (TMPTA), that optionally included or combined or mixed in a mass ratio in the range of 75:25 to 65:35 wherein the BMA may be present in a relative range of 65-75 and the TMPTA may be present in a relative range of 25-35.

The physical properties of TMPTA, such as viscosity, low volatility and refractive index, make the material uniquely advantageous in a material or composition or film or coating of the present disclosure. TMPTA is less viscous, for example, than hexamethylene diacrylate (HMDA) and bisphenol A diglycerolate dimethacrylate but more viscous than divinylbenzene (DVB). Of the two, TMPTA and HMDA, TMPTA has the higher refractive index (RI=1.474 and 1.456 for TMPTA and HMDA respectively).

BMA is unique in the composition, material and film of the present disclosure in that the monomer has a high refractive index (for an monomer or polymer) of 1.512. The refractive index of BMA therefore helps increase the final refractive index of the film.

Dispersing nanocrystals in BMA alone or with the aid of a solvent such as propylene glycol methyl ether acetate (PGMEA) resulted in films that are difficult to cure by UV or were cracked upon heating at 120 C and above.

Another multifunctional acrylic monomer, such as TMPTA, HMDA, DVB or bisphenol A diglycerate dimethacrylate (Bisphenol A) may be added as a potential additive to increase the viscosity of the formulation. Films from HMDA-BMA, DVB-BMA and Bisphenol A-BMA combinations were found however to be too brittle in formulations containing nanocrystals of the present disclosure such that these films of these combinations cracked when heated at 120 C or above.

Additionally, TMPTA and HMDA have refractive indexes<1.49; such that including these monomers reduces the refractive index of the final formulation and film product when compared with BMA.

As described herein, the specific combinations of BMA, TMPTA and nanocrystals of the present disclosure, in the ratios and amounts described herein, provide unexpected advantages in a combination of physical properties, including but not limited to refractive index, light transmittance, temperature resistance and viscosity.

A mass ratio of BMA to TMPTA in the range of 75:25 to 65:35 as described herein has also been discovered to provide unique and unexpected advantages, i.e. high refractive index, high transmittance, and high temperature resistance, in the formulations or compositions of films of the present disclosure. While materials and/or films containing mass ratios of BMA to TMPTA ranging from 95:5 to 80:20 (i.e., 95:5, 90:10 and 80:20) with nanocrystal loading of 80 wt % and above were stable at temperatures below 120 C, as shown in Table 1. Nanocrystals of the present disclosure dispersed in TMPTA, without BMA, provided a lower refractive index material than with BMA. Films produced from a mass ratio of BMA to TMPTA according to the presently disclosed technology demonstrated enhanced film quality with, for example, reduced surface roughness and thicker films due, at least in part, to higher viscosity.

In addition to the nanocrystals and monomers and/or oligomers and/or polymers of the formulations or compositions or films of the present disclosure, a photo-initiator may be included, such as benzophenone, optionally in an amount of 1-5 wt % based on the total weight of the formulation or composition or material of the present disclosure. Such a photo-initiator may be mixed or included or dissolved or dispersed in the monomer and/or oligomer and/or polymer mix of the presently disclosed formulation by means known in the art, such as by stirring or vortexing at temperature of, for example, in the range of 20-30 C.

While benzophenone has been exemplified herein as a photo initiator, other photo initiators can also or otherwise be employed depending on, for example, curing time and lamp type. Other photo initiators of the present disclosure include Speedcure BEM and TPO (diphenyl(2,4,6-trimethylbenzoyl)-phosphine oxide), which may allow for considerable reduction in the required UV exposure time.

The present disclosure provides a nanocomposite, composition comprising or containing an organic mixture, said mixture comprising acrylate and methacrylate monomers and/or oligomers, capped nanocrystals, wherein said capped nanocrystals are present in the nanocomposite or composition in an amount of greater than 50% by weight of the nanocomposite, composition.

A nanocomposite or composition of the present disclosure optionally has a curing agent and/or photo-initiator.

A nanocomposite or composition of the present disclosure optionally has a photosensitizer, and/or plasticizer, and/or toughener, and/or thickener, and/or thinner, and/or surfactant, and/or flexibilizer, and/or anti-color agent, and/or other functional additives.

A nanocomposite or composition of the present disclosure optionally has a viscosity of less than 12,000 Cps at 20 C as measured by a Brookfield RVDV–II+PCP cone and plate viscometer. A nanocomposite and composition of the present disclosure additionally or alternatively has a transmittance higher than 60% at a wavelength of 400 nm as measured by a Perkin Elmer Lambda 850 Spectrophotometer in a 1 cm path length cuvette. A nanocomposite and composition of the present disclosure contains or comprises an organic mixture of benzyl methacrylate and trimethylolpropane triacrylate. Such a nanocomposite, composition of the present disclosure optionally contains or comprises a weight ratio of benzyl methacrylate to TMPTA in the range of 75:25 to 65:35.

The present disclosure provides a coating or film comprising or containing an organic mixture, said mixture comprising acrylate and methacrylate monomer units, capped nanocrystals, wherein said capped nanocrystals are present in the coating or film in an amount of greater than 50% by weight of the coating and film.

A nanocomposite, composition, coating or film of the present disclosure additionally can comprise or contain nanocrystals capped with at least one capping agent selected from 2-[2-(2-9-methoxyethoxy) ethoxy acetic acid, and/or methoxy(triethyleneoxy) propyltrimethoxysilane, and/or 3-methacryloyloxypropyltrimethoxysilane, and/or n-octyl trimethoxysilane, dodecyltrimethoxysilane, and/or m,p-ethylphenethyl trimethoxysilane.

A nanocomposite, composition, coating or film of the present disclosure can additionally comprise or contain nanocrystals comprising or containing at least one of $ZrO_2$, $HfO_2$, $TiO_2$, and ZnO.

A nanocomposite, composition, coating or film of the present disclosure optionally and/or additionally possesses a refractive index of greater than 1.8 at 400 nm.

In some embodiments the nanocomposite, composition, coating or film of the present disclosure does not include the purposeful addition of solvents.

In some embodiments the nanocomposite, composition, coating or film of the present disclosure does not include the purposeful addition of solvents of the mixture comprising acrylate and methacrylate monomers and/or oligomers of the nanocomposite, composition, coating or film.

In some embodiments the nanocomposite, composition, coating or film of the present disclosure does not include purposeful addition of solvents of benzyl methacrylate and trimethylolpropane triacrylate (TMPTA).

In some embodiments the nanocomposite, composition, coating or film of the present disclosure does not include purposeful addition of solvents selected from PGMEA, PGME (Propylene glycol methyl ether), ethanol, THF, and butanol.

The present disclosure further provides a method of making a nanocomposite, composition, coating or film formulation comprising or involving mixing capped nanocrystals with an organic mixture of acrylate and methacrylate monomers and/or oligomers, and at least one curing agent, said nanocrystals being present in an amount of greater than 50% by weight of the nanocomposite, composition, coating or film.

A method of the present disclosure is optionally performed in the absence of solvents.

A method of the present disclosure is optionally performed in the absence of solvents for the mixture comprising acrylate and methacrylate monomers and/or oligomers of the nanocomposite, composition, coating or film.

A method of the present disclosure is optionally performed in the absence for solvents of benzyl methacrylate and trimethylolpropane triacrylate (TMPTA).

A method of the present disclosure comprises or involves mixing an organic mixture comprising or containing benzyl methacrylate and trimethylolpropane triacrylate (TMPTA).

A method of the present disclosure further comprises or involves mixing benzyl methacrylate and TMPTA in weight ratio of benzyl methacrylate to TMPTA in the range of 75:25 to 65:35, such as in a ratio of 70:30.

A method of the present disclosure comprising or involves mixing nanocrystals capped with at least one of 2-[2-(2-9-methoxyethoxy) ethoxy acetic acid, and/or methoxy(triethyleneoxy) propyltrimethoxysilane, and/or 3-methacryloyloxypropyltrimethoxysilane, and/or n-octyl trimethoxysilane, dodecyltrimethoxysilane, and/or m,p-ethylphenethyl trimethoxysilane, with an organic mixture of acrylate and methacrylate monomers and/or oligomers, and at least one curing agent, said nanocrystals being present in an amount of greater than 50% by weight of the nanocomposite, composition, coating or film.

A method of the present disclosure comprises or involves mixing capped nanocrystals, wherein the nanocrystals comprise or contain at least one of $ZrO_2$, $HfO_2$, $TiO_2$, and ZnO.

A method of the present disclosure produces a nanocomposite, composition, coating or film having a refractive index greater than 1.8 at 400 nm.

The present disclosure further provides a coating comprising or containing the nanocomposite, composition, coating or film described herein on at least a portion of a surface of a substrate.

A coating of the present disclosure has a thickness ranging from 100 nm to 1 mm, wherein the transmittance of the coating with 1 μm thickness is higher than 89% at a wavelength of 400 nm, and the percentage haze is less than 2%, preferably less than 1.5%, more preferably less than 1%, and most preferably less than 0.5%.

A coating of the present disclosure optionally and/or additionally has a refractive index greater than 1.8 at 400 nm.

The present disclosure provides a method of producing a coating of the present disclosure comprising or involving applying the nanocomposite, composition, coating or film of the present disclosure to a surface or substrate of the present disclosure by at least one of dip coating, spraying, screen printing, roll-to-roll printing, a draw-bar, spin coating, or slot die coating, and curing said monomers and/or oligomers by activating said curing agent.

A method of curing of the present disclosure comprises or involves activating comprises illumination with radiation in the UV wavelength and/or thermal curing. A coating of the present disclosure comprises or contains a substrate comprising or containing glass, indium tin oxide (ITO), doped ZnO, GaN, AlN, SiC, Poly(3,4-ethylenedioxythiophene) (PEDOT), poly(styrene sulfonate) (PSS) doped PEDOT, Polyethylene terephthalate (PET), Polyethylene naphthalate (PEN), or doped poly(4,4-dioctylcyclopentadithiophene).

The present disclosure further provides an active component comprising or containing an LED, organic LED, touch screen, display, sensor, or a solar cell, said active component, comprising or containing a coating or a film or a layer of the present disclosure.

LIST OF FIGURES AND TABLE

FIG. 1A: An OLED device without light extraction scheme.

FIG. 1B: Internal light extraction with scatterers or surface texture, with all light being scattered.

FIG. 1C: The present invention, an ideal gradient-index layer with sparse light scatterers adjacent to the transparent electrode. The dashed rays represent the light travels within the cone of acceptance (the maximum solid angle where light can be coupled into the next layer) and the solid rays represent the light travels outside. The solid rays are refracted backward by the gradient-index profile, resulting in a much longer optical path and much higher scattering probability than the dashed rays, a more efficient mechanism compared to (b).

Figure 2A:
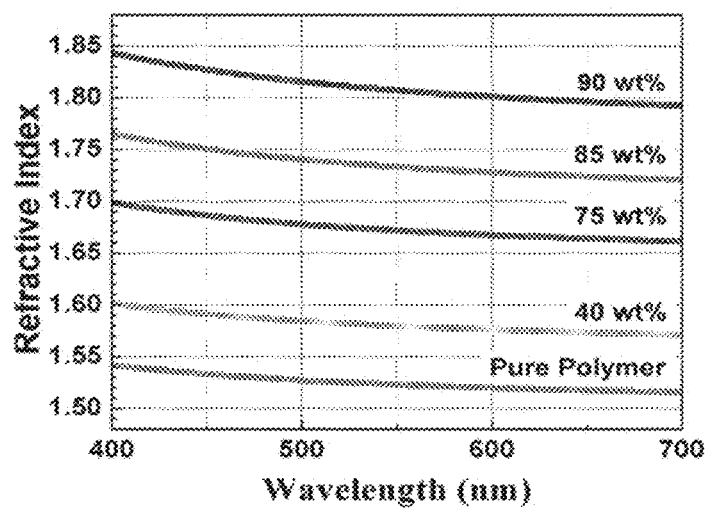

FIG. 2A: The refractive index data of a photo-curable acrylic formulation, developed by Pixelligent, with different nanocrystal loadings.

Figure 2B:
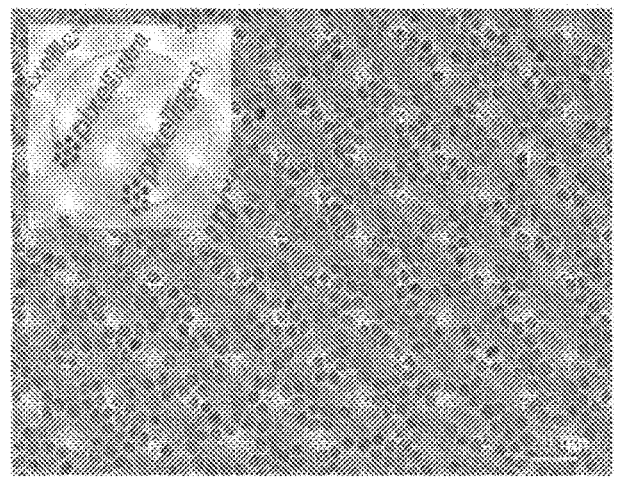

FIG. 2B: Transmission electron microscopy of the nanocrystal loaded polymer. The inset showcases the clarity of a 5 μm thick nanocomposite film with 80 wt % $ZrO_2$ nanocrystal loading.

Figure 3:
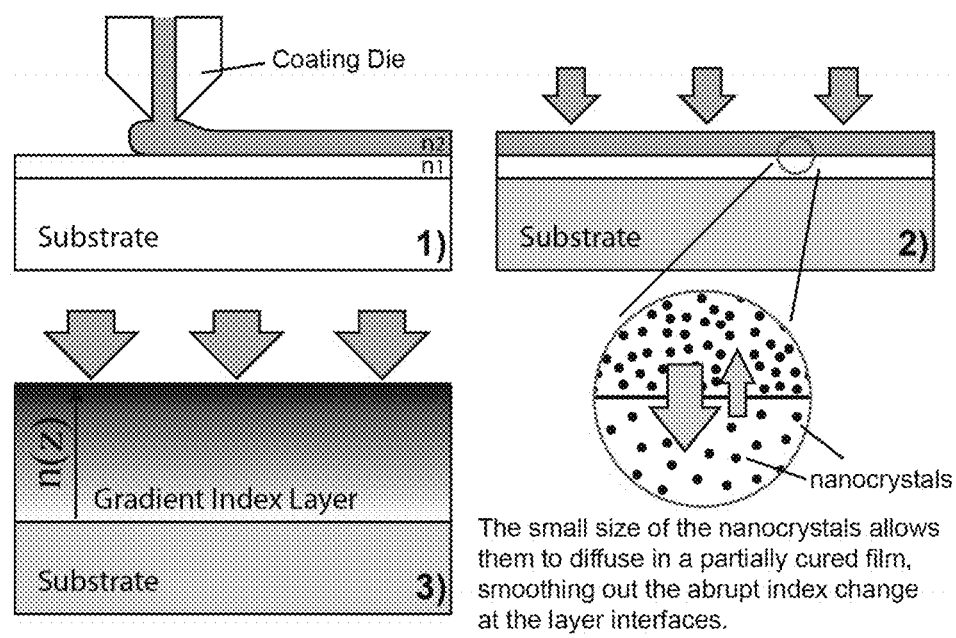

FIG. 3: An illustration of the process flow of the present invention to create a nanocomposite gradient index layer. 1) The first layer of nanocomposite is applied on the substrate using slot-die coating as an example, other film formation processes could also be used; 2) the applied layer is partially UV-cured (shown with four arrows above the films in (2) and (4), also other curing mechanism like thermal, electron exposure, etc.) to retain certain mechanical strength to with stand the next coating step; 3) a second nanocomposite layer with a different nanocrystal loading is again applied by slot-die coating; 4) the second layer is again partially cured; and step 3 and 4 may be repeated until the intended index profile is completed; 5) and then a final cure is applied to solidify the gradient index layer. After the film is solidified, the nanocrystals will no longer be able to diffuse. Note: For simplicity, the light scatterers are not shown in the figure.

Figure 4A:
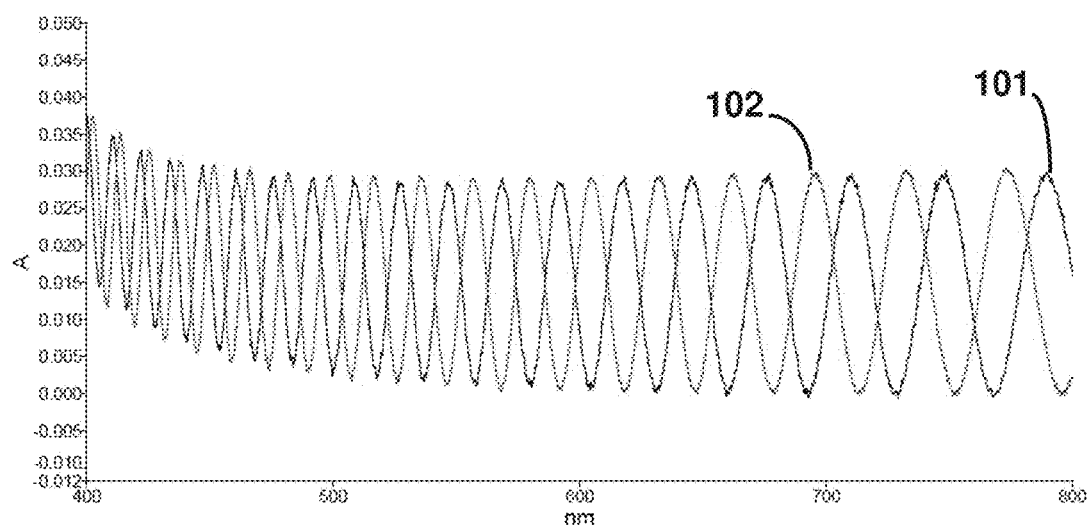

FIG. 4A: UV absorption spectrum of film from formulation ($ZrO_2$-(2-[2-(2-9-methoxyethoxy)ethoxy]acetic acid) in 70:30 BMA-TMPTA) after post bake at (101) 120 C for 3 minute in air, (102) thermal bake at 175 C for 1 hour under $N_2$.

Figure 4B:
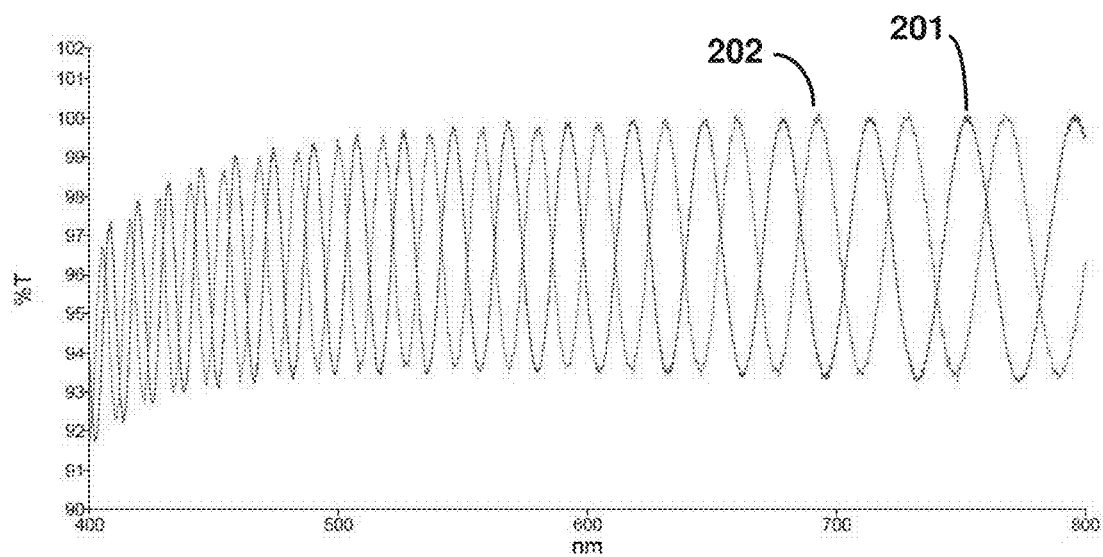

FIG. 4B: UV transmission spectrum of film from formulation ($ZrO_2$-(2-[2-(2-9-methoxyethoxy)ethoxy]acetic acid) in 70:30 BMA-TMPTA) after post bake at (201) 120 C for 3 minute in air, (202) thermal bake at 175 C for 1 hour under $N_2$.

Figure 5A:
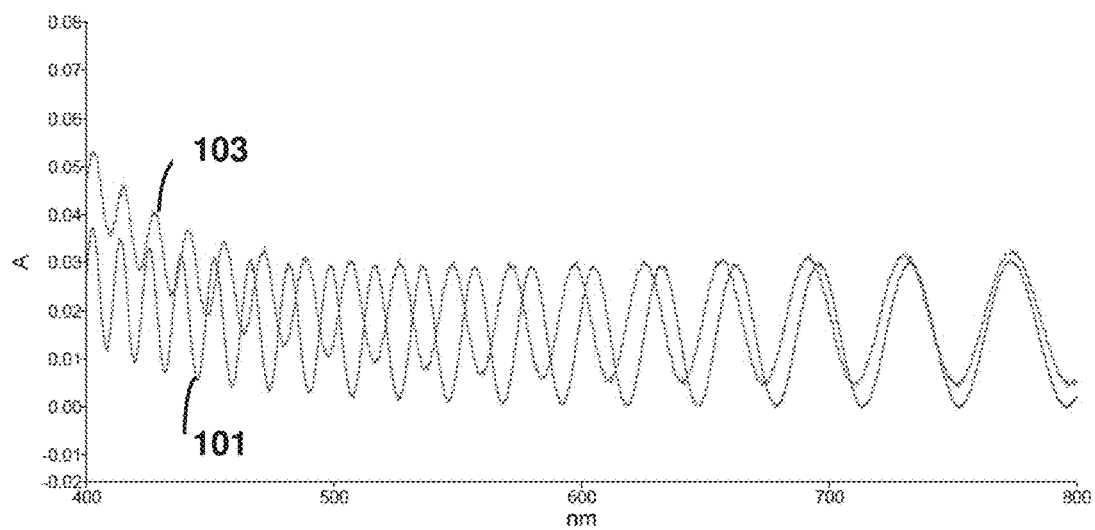

FIG. 5A: UV absorption spectrum of film from formulation ($ZrO_2$-(2-[2-(2-9-methoxyethoxy)ethoxy]acetic acid) in 70:30 BMA-TMPTA) after post bake at (101) 120 C for 3 minute in air, (103) thermal bake at 200 C for 1 hour under $N_2$.

Figure 5B:
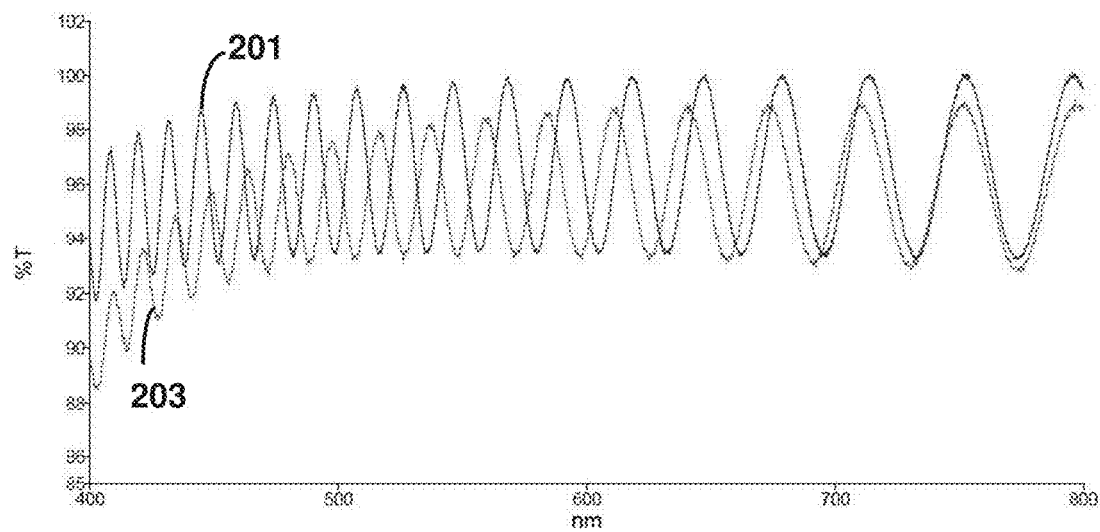

FIG. 5B: UV transmission spectrum of film from formulation ($ZrO_2$-(2-[2-(2-9-methoxyethoxy) ethoxy]acetic acid) in 70:30 BMA-TMPTA) after post bake at (201) 120 C for 3 minute in air, (203) thermal bake at 200 C for 1 hour under $N_2$.

Figure 6A:
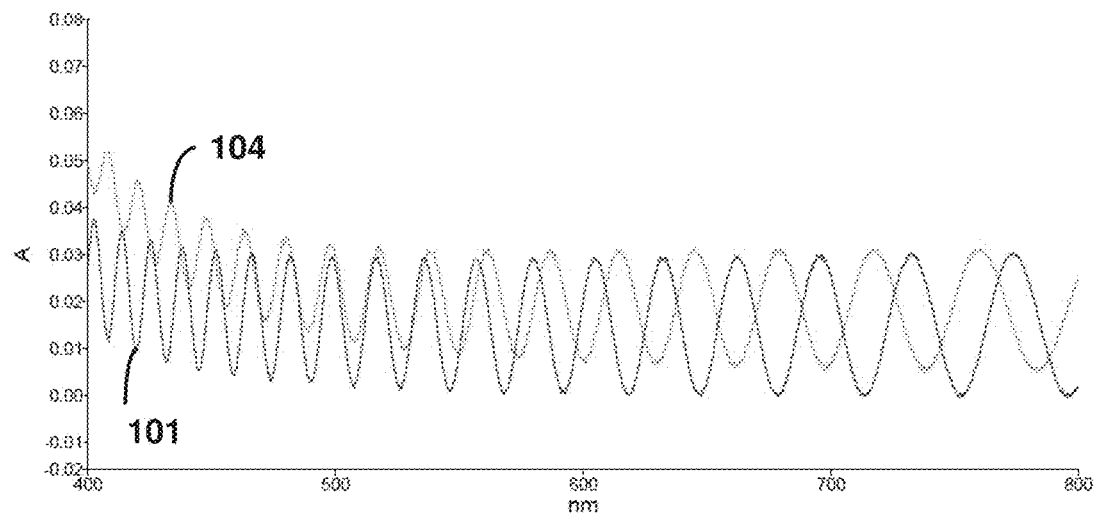

FIG. 6A: UV absorption spectrum of film from formulation ($ZrO_2$-(2-[2-(2-9-methoxyethoxy)ethoxy]acetic acid) in 70:30 BMA-TMPTA) after post bake at (101) 120 C for 3 minute in air, (104) thermal bake at 200 C for 2 hour under $N_2$.

Figure 6B:
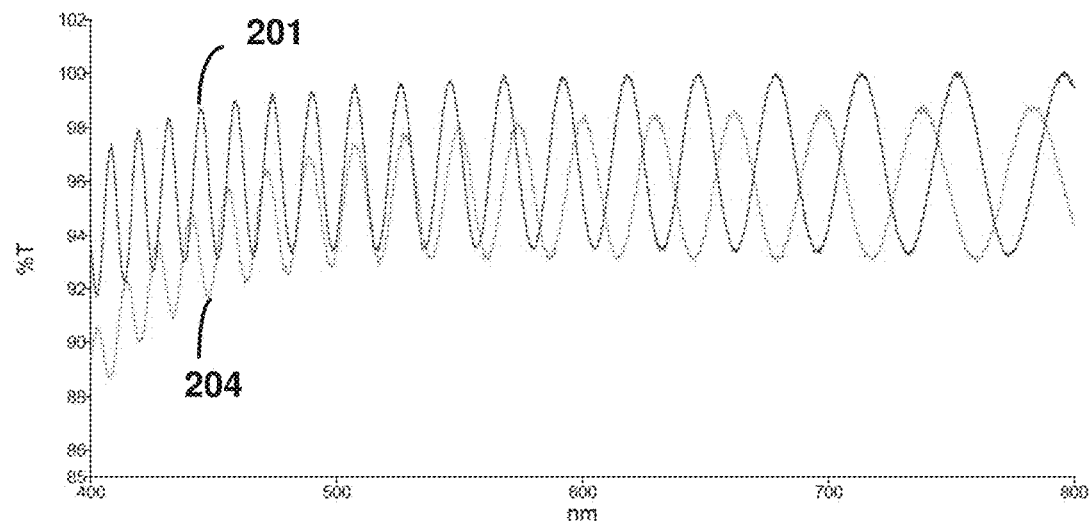

FIG. 6B: UV transmission spectrum of film from formulation ($ZrO_2$-(2-[2-(2-9-methoxyethoxy)ethoxy]acetic acid) in 70:30 BMA-TMPTA) after post bake at (101) 120 C for 3 minute in air, (104) thermal bake at 200 C for 2 hour under $N_2$.

Table 1: Film results of capped $ZrO_2$ nanocrystals in monomer mixture. 'Good' indicates that the film does not yellow or crack when heated at those indicated temperatures. 'Cracked' indicates that the film cracked during thermal baking. Disadvantage of this formulation is that it comprises of PGMEA to aid in the solubility.

The present application provides an OLED lighting device containing an internal light extraction layer, the internal light extraction layer containing: a high refractive index nanocomposite containing inorganic nanocrystals embedded in a polymer matrix. The OLED of the presently disclosed technology may contain nanocrystals containing $ZrO_2$ nanocrystals. The OLED of the present disclosure may contain nanocrystals having a size smaller than 10 nm in at least one dimension. The OLED of the present disclosure may contain a polymer matrix containing an acrylic polymer. The internal light extraction layer of OLEDs of the present disclosure may have a refractive index greater than 1.6 at visible wavelength in at least part of the layer. Further, the internal light extraction layer of OLEDs of the present disclosure may have an index gradient. The index gradient of OLEDs of the present disclosure may results at least in part from a concentration gradient of the inorganic nanocrystals. The internal light extraction layer of OLEDs of the present disclosure may further include light scattering particles. Scattering particles of the OLEDs of the present disclosure may include any one, or combinations of $TiO_2$ particles, polymer beads, and/or agglomerated $ZrO_2$ nanocrystals.

The present disclosure further provide methods of manufacturing an internal light extraction layer for an OLED lighting device that includes applying a first nanocomposite layer comprising inorganic nanocrystals dispersed in a polymer matrix with one concentration on a substrate; at least partially curing the first nanocomposite layer; applying a second nanocomposite layer on at least part of the first nanocomposite layer, the second nanocomposite layer containing inorganic nanocrystals dispersed in a polymer matrix with a second concentration; optionally allowing the second nanocomposite layer to at least partially settle on said first nanocomposite layer for an intermediate period; and fully or further curing the first and second nanocomposite layers to form an internal light extraction layer of the present disclosure.

EXAMPLES

Example 1

In one example of said exemplary non-limiting formulation, acrylic monomers, benzyl methacrylate (BMA) and trimethylolpropane triacrylate (TMPTA), was mixed in a mass ratio of 70-75 to 25-30. 1-5 wt % of benzophenone as photo initiator, was dissolved in the monomer mix either by stirring or vortexing at temperature of 20-30 C. The solution was then filtered to remove dusts and then added to dry $ZrO_2$ nanocrystal and allowed to soak in the monomer blend until no $ZrO_2$ powder was observed. In large scale, gently shaking the dried nanocrystals with the monomer blend is acceptable. Once all $ZrO_2$ nanocrystals powder was completely dispersed in BMA-TMPTA, the viscous suspension was mixed for 10-15 hours. Finally, the viscous suspension was filtered before processing the film.

The suspension was validated by coating films and characterizing the physical properties of the films such as thermal stability and transmittance.

As a standard method, the suspension was coated on a 2" silicon wafer or fused silica wafer to inspect its quality. The wafers were cleaned before applying the film to remove contaminants and dusts. 3-4 micron thick film was spin coated on silicon wafer at 1000-4000 rpm for 1-5 minute.

An optional pre-bake process at 90 C may be performed to remove the residual solvent if that is a concern. In these formulations the solvent is typically less than 10 wt %, more preferably less than 1 wt %. The film was inspected for defects from undispersed particles or air bubbles. If no defects were observed, its surface roughness is measured using a surface profilometer.

The film coated on glass slide or fused silica wafer was cured by UV exposure for 60-200 seconds using a Dymax EC-5000 system with a mercury 'H' bulb and then post-baked for 2-5 minutes at 120-150 C under air. Further, the thermal stability of the film was tested by heating the film at a temperature of 175 C or above, more preferably 200 C, under nitrogen atmosphere for 1-2 hours. A crack free, colorless film is desirable and indicates a good formulation.

These film demonstrate a refractive index of 1.80 or greater at 400 nm and transmittance>89% at 400 nm.

The refractive index is measured with a Woollam M-2000 spectroscopic ellipsometer in the spectral range from 350 nm to 1700 nm and the transmittance was measured using a Perkin Elmer Lambda 850 Spectrophotometer.

This example formulation with 65-75:25-35 mass ratio of BMA to TMPTA with nanocrystal loading of 50 wt % and above produced films that are UV curable and can withstand a thermal baking at 200 C for 1-2 hour under nitrogen, as shown in Table 1.

Example 2

Films spin coated from formulation containing zirconium oxide nanocrystals capped with 2-[2-(2-9-methoxyethoxy)ethoxy]acetic acid at 50-80 wt % loading in the BMA-TMPTA (65-75:25-35 mass ratio) were stable and did not crack when heated at temperatures up to 200 C. However, films from formulation containing zirconium oxide nanocrystals capped with 2-[2-(2-9-methoxyethoxy)ethoxy]acetic acid at 82-85 wt % loading in the BMA-TMPTA (65-75:25-35 mass ratio) were stable only at temperatures below 120 C, as shown in Table 1. Also, zirconium oxide nanocrystals modified with other capping agents such as methoxy(triethyleneoxy) propyltrimethoxysilane and/or 3-methacryloyloxypropyltrimethoxysilane and/or n-octyl trimethoxysilane and/or dodecyltrimethoxysilane and/or m,p-ethylphenethyl trimethoxysilane formed good dispersions in BMA-TMPTA mixture, as well as good films, but was only stable up to 120 C.

One advantage of this exemplary non-limiting embodiment is that both monomers are in liquid form at room temperature so no solvent is necessary at room temperature and the film is UV curable. Surface modified $ZrO_2$ nanocrystals are dispersed directly in the monomer. Such a direct dispersion eliminates, for example, the need to remove the solvent at a later step.

Nanocrystals of the exemplified embodiments of the present disclosure have been surface modified with various capping agents such as 2-[2-(2-9-methoxyethoxy) ethoxy] acetic acid and/or methoxy(triethyleneoxy) propyltrimethoxysilane and/or 3-methacryloyloxypropyltrimethoxysilane and or n-octyl trimethoxysilane and/or dodecyltrimethoxysilane and/or m,p-ethylphenethyl trimethoxysilane. In an exemplified method of producing the capped nanocrystals of the present disclosure, the as-synthesized nanocrystals are allowed to settle for at least 12 hours after synthesis. Since the nanocrystals are surface modified in a solvent other than the synthesis solvent, the nanocrystals are separated from the reaction liquid by decanting off the reaction liquid and rinsing the nanocrystals with the capping solvent. The rinsing solvent is decanted off to obtain a wet cake of uncapped nanocrystals.

For the surface modification of the nanocrystals with 2-[2-(2-9-methoxyethoxy) ethoxy]acetic acid, the nanocrystals are suspended in the capping solvent, for example, toluene for 2-[2-(2-9-methoxyethoxy)ethoxy]acetic acid modification, at a loading of 10 wt % or greater, or 20 wt % or greater, or 30 wt % or greater, calculated based on the weight of the wet nanocrystal cake. While the suspension is stirred, the capping agent is added to it slowly. The amount of capping agent used is in the presently exemplified embodiment 8-60 wt % to the weight of the wet nanocrystal cake. The suspension is allowed to stir at 20-27° C. for 10-30 minutes and then refluxed at the boiling point of the capping solvent for 30-60 minutes. After refluxing, the clear solution is cooled to 50-60° C. slowly. This suspension is then filtered to remove dusts and aggregates bigger than 200 nm sizes.

The capped nanocrystals are then precipitated out from the capping solvent using heptane (2-4 times the mass of the capped solution). The precipitated nanocrystals are collected by centrifugation. The nanocrystal thus collected is dispersed in tetrahydrofuran (THF) and again re-precipitated using heptane. This process is repeated twice. The wet cake of nanocrystals collected in the final step is dried under vacuum for at least 12 hours.

TABLE 1

| Monomer mix | Content of $ZrO_2$ to monomer | Capping agent | Post baked at 120 C./60/air | Post baked at 175 C./60/$N_2$ | Post baked at 200 C./N2/60 min |
|---|---|---|---|---|---|
| 2-10 wt % Bisphenol A diglycerolate dimethacrylate in BMA | 50-80 wt % | 2-[2-(2-9-methoxyethoxy) ethoxy]acetic acid | good | cracked | |
| 2-25 wt % TMPTA in BMA | 50-80 wt % | methoxy(triethyleneoxy) propyltrimethoxysilane and 3-methacryloyloxypropyl trimethoxysilane | good | cracked | |
| 25-30 wt % TMPTA in BMA | 50-80 wt % | methoxy(triethyleneoxy) propyltrimethoxysilane and 3-methacryloyloxypropyl trimethoxysilane | good | good | cracked |
| 20-30 wt %T MPTA in BMA | 50-80 wt % | 2-[2-(2-9-methoxyethoxy) ethoxy]acetic acid | good | good | good |
| 25-30 wt % TMPTA in BMA | 50-80 wt % | methoxy(triethyleneoxy) propyltrimethoxysilane | good | cracked | cracked |
| 25-30 wt % TMPTA in BMA | 82-86 wt % | 2-[2-(2-9-methoxyethoxy) ethoxy]acetic acid | good | cracked | cracked |

We claim:

1. An organic light emitting diode (OLED) lighting device comprising an internal light extraction layer, wherein the internal light extraction layer comprises:
   a high refractive index nanocomposite comprising inorganic nanocrystals embedded in a polymer matrix, wherein
   the nanocomposite has a refractive index of 1.7 and higher at 400 nm in at least part of the nanocomposite, and wherein
   a 3-4 micron thick sample of the nanocomposite has an optical transmittance of at least 90% over a range of 440 nm to 800 nm.

2. The OLED lighting device of claim 1, wherein the nanocrystals comprise $ZrO_2$ nanocrystals.

3. The OLED lighting device of claim 1, wherein the nanocrystals have a size smaller than 10 nm in at least one dimension.

4. The OLED lighting device of claim 1, wherein the polymer matrix comprises an acrylic polymer.

5. The OLED lighting device of claim 1, wherein the internal light extraction layer has an index gradient.

6. The OLED lighting device of claim 5, wherein the index gradient results at least in part from a concentration gradient of the inorganic nanocrystals.

7. The OLED lighting device of claim 1, wherein the internal light extraction layer further includes light scattering particles.

8. The OLED lighting device of claim 7, wherein the scattering particles comprise $TiO_2$ particles.

9. The OLED lighting device of claim 7, wherein the scattering particles comprises polymer beads.

10. The OLED lighting device of claim 7, wherein the scattering particles comprise agglomerated $ZrO_2$ nanocrystals.

11. The OLED lighting device of claim 1, wherein the inorganic nanocrystals are capped nanocrystals.

12. The OLED lighting device of claim 2, wherein the inorganic nanocrystals are capped nanocrystals.

13. An organic light emitting diode (OLED) lighting device comprising an internal light extraction layer comprising:
   a high refractive index nanocomposite comprising inorganic nanocrystals embedded in a polymer matrix in an amount of greater than 70% by weight of the nanocomposite, wherein
   the nanocomposite has a refractive index of 1.7 and higher at 400 nm in at least part of the nanocomposite, and wherein
   a 3-4 micron thick sample of the nanocomposite has an optical transmittance of at least 90% over the range of 440 nm to 800 nm.

14. The OLED lighting device of claim 13, wherein the nanocrystals comprise $ZrO_2$ nanocrystals.

15. The OLED lighting device of claim 13, wherein the inorganic nanocrystals are capped nanocrystals.

16. The OLED lighting device of claim 14, wherein the inorganic nanocrystals are capped nanocrystals.

17. The OLED lighting device of claim 1, wherein at least a part of the nanocomposite has a refractive index of 1.8 and higher at 400 nm.

18. The OLED lighting device of claim 13, wherein at least a part of the nanocomposite has a refractive index of 1.8 and higher at 400 nm.

19. The OLED lighting device of claim 1, wherein at least a part of the nanocomposite has a refractive index of 1.9 at 400 nm.

20. The OLED lighting device of claim 13, wherein at least a part of the nanocomposite has a refractive index of 1.9 at 400 nm.

* * * * *